United States Patent

Chien et al.

[11] Patent Number: 6,042,887
[45] Date of Patent: Mar. 28, 2000

[54] PROCESS FOR FORMING A SAUSG INTER METAL DIELECTRIC LAYER BY PRE-COATING THE REACTOR

[75] Inventors: Hung-Ju Chien, Hsinchu; Chia-Cheng Wang, Taipei; Been-Hon Lin, Koasuing, all of Taiwan

[73] Assignee: Taiwan Semiconductor Manufacturing Company, Hsin-Chu, Taiwan

[21] Appl. No.: 09/006,042

[22] Filed: Jan. 12, 1998

[51] Int. Cl.[7] .............................. C23C 16/40; H01L 21/31
[52] U.S. Cl. .................... 427/255.37; 427/579; 427/237; 427/238; 427/99; 438/756; 438/435; 438/790; 438/905
[58] Field of Search ...................... 427/579, 237, 427/238, 255.37, 99; 438/905, 790, 675, 435, 700, 756

[56] References Cited

U.S. PATENT DOCUMENTS

| | | | |
|---|---|---|---|
| 4,892,753 | 1/1990 | Wang et al. | 427/38 |
| 5,356,722 | 10/1994 | Nguyen et al. | 427/569 |
| 5,591,675 | 1/1997 | Kim et al. | 437/195 |
| 5,635,425 | 6/1997 | Chen | 438/631 |
| 5,647,953 | 7/1997 | Williams et al. | 156/643 |
| 5,817,566 | 10/1998 | Jang et al. | 438/424 |
| 5,869,384 | 2/1999 | Yu et al. | 438/431 |
| 5,872,401 | 2/1999 | Huff et al. | 257/758 |

*Primary Examiner*—Roy V. King
*Attorney, Agent, or Firm*—George O. Saile; Stephen B. Ackerman; William J. Stoffel

[57] ABSTRACT

A method of manufacturing an insulating layer 30 (IMD layer) that has a uniform etch rate and forms improved via/contact opening profiles. The method forms a coating film 11 of silicon oxide over the chamber walls 22 of a CVD reactor. Next, the wafer 12 is loaded into the CVD reactor 20. A first insulating layer 30 composed of oxide preferably formed by a sub-atmospheric undoped silicon glass (SAUSG) using TEOS is formed over the semiconductor structure 12. Via/Contact Openings 32 are then etched in the insulating layer 30. The coating film 11 over the interior surfaces (e.g., reactor walls) 22 improves the etch rate uniformity of the first insulating layer 30. The first insulating layer 30 is preferably a inter metal dielectric (IMD) layer.

19 Claims, 1 Drawing Sheet

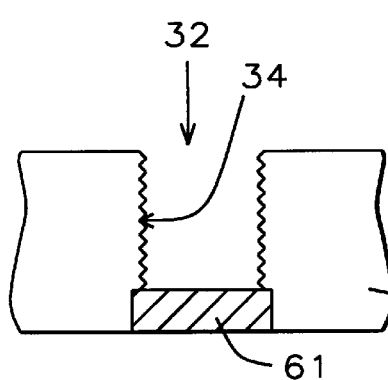
FIG. 1 – Prior Art
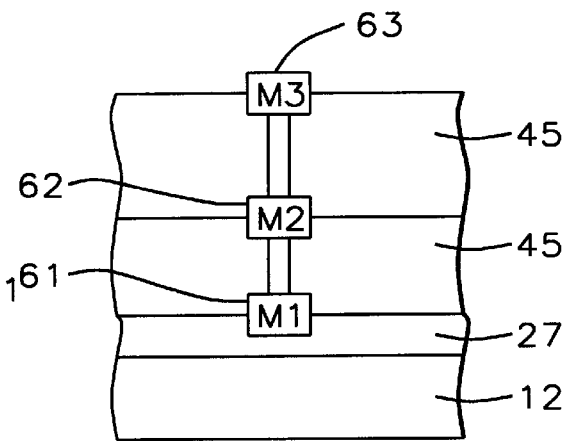
FIG. 2A
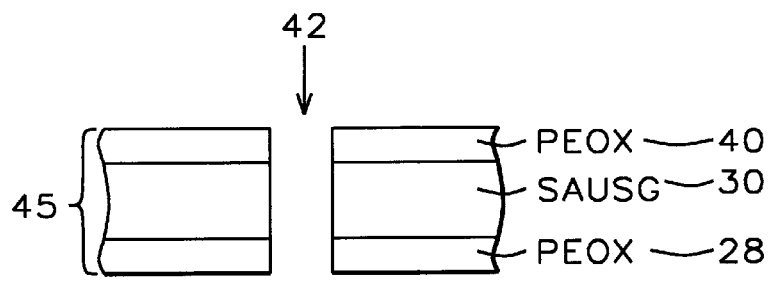
FIG. 2B
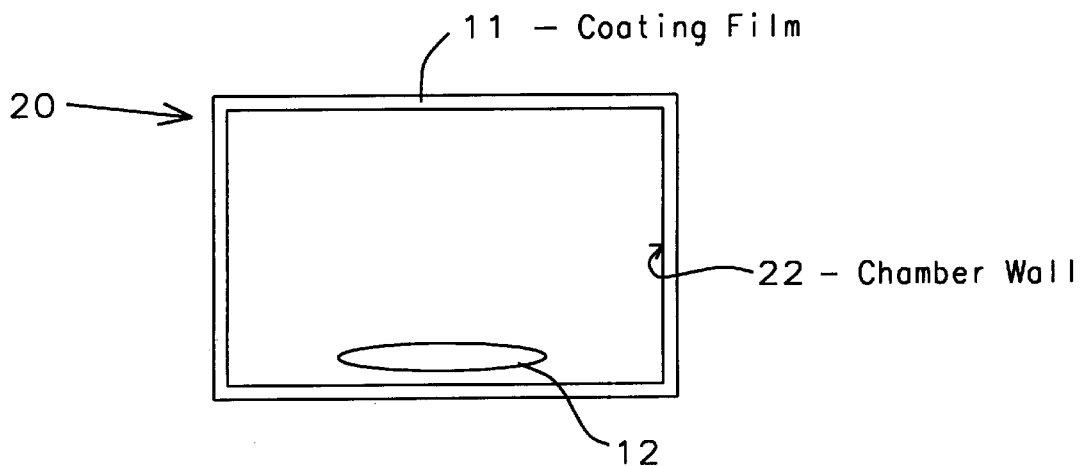
FIG. 3

PROCESS FOR FORMING A SAUSG INTER METAL DIELECTRIC LAYER BY PRE-COATING THE REACTOR

BACKGROUND OF INVENTION

1. Field of the Invention

This invention relates generally to methods of single and in-situ multiple integrated circuit processing steps, including chemical vapor deposition (CVD), plasma enhanced chemical vapor deposition (PECVD), reactor cleaning and coating, and etching. The present invention also relates to a process for forming conformal, planar dielectric layers on integrated circuit wafers and to an in-situ multi-step process for forming conformal, planar dielectric layers that are suitable for interlevel dielectrics for multi-layer metalization interconnects and substrate contacts.

2. Description of the Prior Art

In recent years there continues to be a dramatic density increases in integrated circuit technology. The minimum feature size of lithography has been reduced to below one micrometer. In the fabrication of precision via and contact opening at these reduced dimensions, it is important to form insulating layers (inter metal dielectric (IMD), interlevel dielectric (ILD) layers) that have uniform wet etch rates so that uniform via and contact opening can be formed.

The inventor has found that high non-uniform Etch rates will form a non-uniform contact hole profile having a rough (zig-zag) 34 sidewall profile. See FIG. 1. These uneven sidewall profiles (zig zag shaped sidewalls) causes difficulties for the following sputter barrier (Ti/TiN layers) and tungsten. The Rc-Via will be high and the RC time delay will be lower. In general, the device signal transmitted speed is slowed.

FIG. 1 shows a metal layer 61 with an overlaying insulating layer 31. An opening 32 is formed in the insulating layer 31 using a wet etch that results in a rough sidewall 34.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 4,892,753 (Wang) shows a method of forming a PECVD silicon oxide layer using TEOS decomposition. U.S. Pat. No. 5,635,425 (Chen) shows another method for forming a PE-TEOS oxide layer.

SUMMARY OF THE INVENTION

It is an object of the present invention to provide a method for fabricating a insulating layer (e.g., IMD) that has a uniform wet etch rate.

It is an object of the present invention to provide a method for fabricating a insulating layer that has a uniform etch rate by forming a coating film composed of silicon oxide over the chamber walls of a reactor in which the insulating layer is formed.

It is an object of the present invention to provide a method for fabricating a insulating layer composed of silicon oxide formed using a PE-TEOS process that has a uniform etch rate by forming a coating film composed of silicon oxide over the chamber walls of a reactor in which the insulating layer is formed.

It is an object of the present invention to provide a method to avoid chamber wall and parts damage by the PE-TEOS film, to keep the unreacted particles be fixed by the PE-TEOS film, and prolong parts life and reduce preventive maintenance (PM) frequency.

To accomplish the above objectives, the present invention provides a method of manufacturing an insulating layer over a semiconductor structure comprising:

a) FIG. 3—cleaning interior surface (chamber walls 22) of a reactor 20 in which an insulating layer 30 will be formed on a semiconductor structure 12;

b) depositing a coating film 11 composed of silicon oxide formed by a PE-TEOS process on said interior surface of said reactor;

c) loading a semiconductor structure 12 into said reactor 20;

d) depositing a first insulating layer 30 composed of undoped silicon glass formed by a sub atmospheric process (SAUSG ) on said semiconductor structure 12;

e) removing said semiconductor structure 12 from said reactor;

f) forming a second dielectric layer 40 over said first insulating layer 30;

g) etching opening through said first insulating layer and said first dielectric layer using a BOE etch whereby said coating film on the chamber walls 22 improves the etch uniformity of said first insulating layer.

The invention forms a chamber coating film 11 (seasoning film) before the wafers are processed. The inventions chamber coating film:

improves the wet etch rate uniformity (std. deviation) of a SAUSG (sub atmospheric undoped silicon glass) insulating layer 30 by at least 4%.

protects chamber wall/parts to avoid cleaning damage.

Prevent particles in the chamber 22 from contaminating the wafer because the coating film 11 causes the particles to adhere to the chamber surfaces.

Prolong parts lifetime, reduce preventive maintenance (PM) frequency.

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIG. 1 is a cross sectional view of an insulating layer 31 with an opening 32 with rough sidewall 34 caused by a prior art deposition process.

FIG. 2A is a cross-sectional view of a wafer showings the inter metal dielectric layer 45 of the invention in a typical semiconductor device according to the present invention.

FIG. 2B is a close up cross-sectional view of the IMN layer 45 shown in FIG. 2A including the first insulating layer 30 of the invention in a typical semiconductor device according to the present invention.

FIG. 3 is a cross sectional view of the reactor showing the invention's chamber coating film 11 according to the present invention.

DETAILED DESCRIPTION OF THE PREFERRED ENBODIMENTS

The present invention provides a method of forming an insulating layer over a semiconductor structure. A coating film 11 is formed over the chamber walls 22 before the first insulating layer 30 is deposited. This coating film improves the wet etch rate uniformity of the insulating layer. The first insulating layer 30 is preferably a inter metal dielectric (IMD—formed between metal lines) or interlevel dielectric layer (ILD—formed between the substrate and 1st metal layer).

In the following description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention.

It should be recognized that many publication describe the details of common techniques used in the fabrication process of integrate circuit component. See, E.g., C.Y. Chang, S.M. Sze, in *ULSI Technology*, by The McGraw-Hill Company, Inc. copyright 1997. Those techniques can be generally employed in the fabrication of the structure of the present invention. Moreover, the individual steps of such a process can be performed using commercially available integrate circuit fabrication machines. As specifically necessary to than understanding of the present invention, exemplary technical data are set forth based upon current technology, Future developments in the art may call for appropriate adjustments as would be obvious to one skilled in the art.

Below is a table describing some of the elements of the invention.

and is most preferably an AMC P5000 (Applied Materials, Inc. P.O. Box 58039, Santa Clara, Calif. 95052-8039 Tel: (408)727-5555).

Referring to FIG. 1, a reactor 20 having a chamber with an interior chamber surface 22 (e.g., chamber walls) is cleaned. The cleaning of the reactor removes at least portions of the coating film (season film) 11 from the reactor wall formed during the previous deposition run. The reactor uses preferably $O_2/C_2F_6/NF3$ for cleaning.

In a key step, a coating film 11 is composed of silicon oxide is formed on all the exposed surfaces inside the chamber (e.g., chamber walls or the chamber in which the insulating layer 30 will subsequently be formed over the wafer 12 ) of the reactor. The coating film (seasoning film ) 11 is formed on the chamber walls with every wafer run. The chamber walls are also cleaned every run.

The coating film 11 has a thickness preferably in a range of between about 1000 and 4000 Å and more preferably greater than 2000 Å.

The oxide coating film is preferably formed by a (1) TEOS/$O_2$ LPCVD, (2) PE-TEOS (Plasma enhanced oxidation (PE-OX or PE-TetraEthylOrthoSilane) or (3) a SAUSG-$O_2/O_3$-TEOS process.

The coating can be formed with a low pressure CVD TetraEthylOrthoSilane (TEOS) oxide deposition using a $O_2$/TEOS feed ratio of between about 500:800 and 700:800 and more preferably about 600:800, and a deposition temperature of between about 380 and 420° C. (tgt=400° C.) to a coating film 11 thickness between about 1000 and 5000 Å.

The coating film 11 can be formed of oxide using $O_2/O_3$-TEOS at a pressure of about 60 torr±5 torr.

A semiconductor structure 12 is provided. See e.g., FIG. 2A. The semiconductor structure is understood to possibly include a semiconductor wafer, active and passive devices

| Element | Generic Name | Preferred parameters -Remarks |
|---|---|---|
| 11 | chamber coating layer - Key layer of the invention | oxide - e.g., (LPCVD-TEOS, SA $O_3$ -TEOS, PE_TEOS) thickness greater than 2000 Å, or dep time from 10 to 30 minutes. |
| 12 | Semiconductor structure | |
| 20 | Reactor - chamber | |
| 22 | Chamber wall | |
| 27 | Layer on structure 12 | dielectric layer and/or metal layer |
| 28 | 1st dielectric layer | oxide- oxide - PE-OX, $SiH_4$ —$N_2O$, or $O_2$ - TEOS |
| 30 | 1st insulating layer- | Key layer - oxide layer with improved etch uniformity because of the coating layer 11 - SAUSG (sub atmospheric undoped silicon glass-$O_2/O_3$ - TEOS) |
| 40 | 2nd dielectric layer | oxide - PE-OX, $SiH_4$ —$N_2O$, or $O_2$ - TEOS |
| 45 | IDL 3 layer structure - 28 30 40 | |
| 61 | 1st level metal | |
| 62 | 2nd level metal | |
| 63 | 3rd level metal | |

The process of the invention will work on any single wafer chamber reactor with $O_3/O_2$/TEOS supply, RF and temperature and pressure control. More preferably the method of the invention is performed in a single wafer PECVD reactor. The reactor used by the invention can be a CVD reactor such as, AMC P5000, Precision 5000 SACVD BPSG(™) and USG(™) reactor and the Applied materials— Precision 5000 DCVD xP(™) (dielectric chemical vapor deposition), Centura 5200, and other single wafer systems, formed within the wafer and layers formed on the wafer surface. The term "semiconductor structure" is mean to include devices formed within a semiconductor wafer and the conductive and insulating layers overlying the wafer. The term "semiconductor structure surface" is meant to include the upper most exposed layers on a semiconductor wafer, such as a silicon surface, an insulating layer and metallurgy lines.

Next, the semiconductor structure 12 is loaded into the reactor 20.

As shown in FIG. 3, in the reactor chamber 20, a first insulating layer 30 is deposited on the semiconductor structure 12. The first insulating layer 30 (SAUSG) is most preferably used as an interlevel dielectric layer (ILD), but other uses are possible.

The first insulating layer 30 can be composed of silicon oxide (doped or undoped) and more preferably a silicon oxide formed using an undoped silicon oxide formed by a sub-atmospheric $O_3$-TEOS process (SAUSG). The SAUSG layer 30 is the preferred inter metal dielectric layer to use with the coating process of the invention because the IMD SAUSG layer 30 has uniform sidewall/bottom step coverage and good gap filling capability. The first insulating layer 30 preferably has a thickness in a range of between about 2000 and 8000 Å.

The first insulating layer 30 composed of SAUSG formed as shown below:

TABLE

Preferred SAUSG Process For The First Insulating Layer 30

| parameter | Unit | low limit | High limit |
|---|---|---|---|
| ratio of 03 to TEOS |  | 1:10 | 5:10 |
| reactant - TEOS | sccm | 2000 | 4000 |
| $O_2$ flow | sccm | 3000 | 5000 |
| Pressure | torr | 100 | 600 |
| $O_3$ concentration | % | 9% | 15% |
| Temperature | ° C. | 300 | 500 |

The first insulating layer preferably has a Ri=1.45±0.02 and film stress (tensile) between − +1.5E9 and 3.85E9 dyne/cm$^2$.

Next, the semiconductor structure 12 is removed the reactor.

Referring to FIGS. 2A and 2B, an example of the invention's first insulating layer 30 used as a inter metal dielectric layer is shown. FIG. 2B shows the smooth opening 42 created by the process of the invention. The invention's oxide layer 30 can be formed as a single layer 45 between metal layers. A first metal layer 61 is formed over layer 27 over the semiconductor structure 12.

In a preferred embodiment, a IMD three layer structure 45 is formed over the first metal layer 61. The ILD three layer structure 45 is shown FIG. 2B. A first dielectric layer 28 is formed over the first metal layer 61 and the layer 27. The first dielectric layer 28 is composed of oxide preferably formed by a plasma enhanced process (PE-OX), $SiH_4$—$N_2O$ or $O_2$-TEOS process and can be formed using the same processes used to form the second dielectric layer 40 as describe below.

The first insulating layer 30 is preferably formed over the first dielectric layer 28. The first insulating layer 30 is formed as describe above.

A second dielectric layer 40 is then formed over the first insulating layer 30. The second dielectric layer 40 is preferably composed of PE-OX preferably has a thickness in a range of between about 1000 and 5000 Å. The second dielectric layer 40 is preferably composed of PE-OX thickness greater than about 1000 Å.

TABLE

Preferred Parameters For The First and Second Dielectric Layers 28 40

| Parameter | Unit | Low limit | High limit |
|---|---|---|---|
| PE-TEOS process |  |  |  |
| reactant TEOS | sccm | 500 | 1100 |
| Pressure | torr | 4 | 15 |
| $O_2$ | sccm | 300 | 900 |
| Temp | ° C. | 300 | 500 |
| PEOX Process |  |  |  |
| Temp | ° C. | 300 | 500 |
| $SiH_4$ | Sccm | 80 | 160 |
| $N_2O$ | sccm | 800 | 1500 |
| Pressure | Torr | 1.5 | 4.0 |

Next, an opening through the first insulating layer (e.g., SAUSG) 30 and the first dielectric layer (PE-OX) 40 to expose the underlying metal layer 61 is formed using a buffered oxide etch (BOE) etch. The chamber coating film 11 improves the etch uniformity of the first insulating layer 30.

The coating film 11 of the invention improves the etch rate uniformity of the first insulating layer 30. The coating film 11 is formed over the chamber wall of the PECVD reactor. The inventor theorizes that the coating film improves the first insulating layer etch rate by lowering the deposition rate of the insulating layer 30 thus creating a more uniform film with a more uniform etch rate.

The inventor theorizes that the coating film improves the insulating film 30 etch rate uniformity because of the following. The oxide coating film 11 reduces the deposition rate of the subsequently deposited SAUSG insulating layer (IMD) 30 over the wafer. The lower deposition rate of the SAUSG insulating layer 30 occurs because the SAUSG TEOS oxide layer 30 will deposit on the chamber wall faster if the chamber wall 22 is coated with the PE-TEOS or $O_3$-TEOS coating layer 11. It is thought that the oxide coating layer 11 competes with the semiconductor structure 12 surface for the (TEOS) reactant gas and therefore slows the oxide 30 deposition on the semiconductor structure 12. This creates a denser TEOS oxide layer 30 that results in a slower TEOS oxide etch rate (more resistant to BOE etchants). The oxide layer 30 etch rate becomes more uniform thus creating smoother, more uniform via and contact openings.

Experiments were performed to determine the etch rate uniformity of the insulating layer 30 as a function of coating layer 11 thickness and deposition time. As shown in the table below, different thickness of Coating layer 11 were coated in a chamber followed by a depositing a SAUSG layer 30 on monitor wafers. Oxide SAUSG layer 30 thickness measurements were by a SM 300 on 9 sites per wafer. The wet etch rate uniformity (WER %) was calculated as the standard deviation of the 9 data sites. The wet etch rate is a good index for the roughness of the contact/via hole since the wet etch is isotropic.

TABLE

Chamber Coating layer 11 the thickness vs Wet etch rate uniformity (WER %)

| Approximate Thickness of the chamber coating film (seasoning film 11) Å | Deposition time (sec) for the coating layer 11 | Wet etch rate uniformity (Std. Deviation of 9 sites) |
|---|---|---|
|  | 0 | 6.4 |
| 600 | 5 | 8.2 |
| 1200 | 10 | 5.5 |
| 1800 | 15 | 4.5 |
| 2400 | 20 | 5.1 |
| 3000 | 25 | 3.8 |
| 3500 | 30 | 3.1 |

As can be seen from the table, the thicker the coating film 11, the better the wet etch rate uniformity.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an insulating layer over a semiconductor structure comprising the sequential steps:
    a) cleaning said chamber walls of said reactor and depositing a coating film composed of silicon oxide on chamber walls of a reactor;
    b) loading the semiconductor structure into said reactor;
    c) depositing a first insulating layer composed of silicon oxide oversaid semiconductor structure; said first insulating layer is formed by a SAUSG $O_3$-TEOS process comprising: a ratio of $O_3$ to TEOS between about 1:10 and 5:10; flow rate of reactant-TEOS between 2000 and 4000 sccm; a $O_2$ flow rate between 3000 and 5000 sccm; a pressure between 100 and 600 torr; a $O_3$ concentration between 9% and 15%; a temperature between 300 and 500° C.; and
        said first insulating layer has a refractive index (Ri) between 1.43 and 1.47 and film tensile stress between about +1.5E9 and 3.85E9 dyne/cm$^2$;
    d) removing said semiconductor structure from said reactor; and
    e) etching an opening through at least said first insulating layer whereby said coating film improves the etch uniformity of said first insulating layer.

2. The method of claim 1 which step (a) further includes cleaning said chamber walls of said reactor with a mixture comprising $O_2$, $C_2F_6$ and $NF_3$.

3. The method of claim 1 wherein said reactor is a single wafer chamber, chemical vapor deposition (CVD) reactor.

4. The method of claim 1 wherein said reactor being a single wafer chamber, chemical vapor deposition (CVD) reactor selected from the group consisting of AMC P5000 by Applied Materials, Inc. and a Centura 5200.

5. The method of claim 1 wherein said coating film has a thickness greater than 2500 Å.

6. The method of claim 1 wherein said coating film has a thickness in a range of between about 1000 and 4000 Å.

7. The method of claim 1 wherein said first insulating layer is composed of silicon oxide formed by a SAUSG process having a thickness in a range of between about 2000 and 8000 Å.

8. The method of claim 1 wherein said semiconductor structure comprises a first dielectric layer, and said first insulating layer is formed on said first dielectric layer and a second dielectric layer is formed on said first insulating layer; and said opening is etched through said first dielectric layer, said first insulating layer and said second dielectric layer; said second dielectric layer composed of silicon oxide formed using a PE-OX process with a thickness in a range of between about 1000 and 5000 Å.

9. The method of claim 1 wherein said opening is etched using a buffered oxide etch.

10. A method of fabricating an insulating layer over a semiconductor structure comprising the sequential steps:
    a) cleaning chamber walls of a reactor in which an insulating layer will be formed on the semiconductor structure;
    b) depositing a coating film composed of silicon oxide formed by a plasma enhanced process using TEOS on said chamber walls of said reactor; said coating film having a thickness greater than 1000 Å;
    c) loading the semiconductor structure into said reactor;
    d) depositing a first insulating layer composed of undoped silicon glass using a SAUSG $O_3$-TEOS process on said semiconductor structure; said first insulating layer is formed by said SAUSG $O_3$-TEOS process; comprising: ratio of $O_3$ to TEOS between about 1:10 and 5:10; flow rate of reactant-TEOS between 2000 and 4000 sccm; a $O_2$ flow rate between 3000 and 5000 sccm; a pressure between 100 and 600 torr; a $O_3$ concentration between 9% and 15%; a temperature between 300 and 500° C.;
        said first insulating layer has a refractive index (Ri) between 1.43 and 1.47 and film tensile stress between about +1.5E9 and 3.85E9 dyne/cm$^2$;
    e) removing said semiconductor structure from said reactor; and
    f) etching an opening through at least said first insulating layer using a buffered oxide etch (BOE) etch whereby said cleaning and said coating film improves the etch uniformity of said first insulating layer.

11. The method of claim 10 wherein said reactor being a single wafer chamber, chemical vapor deposition (CVD) reactor.

12. The method of claim 10 wherein the cleaning of said chamber wall of said reactor uses chemicals comprising $O_2/C_2F_6/NF3$.

13. The method of claim 10 wherein said coating film has a thickness greater than 2500 Å.

14. The method of claim 10 wherein the said coating film has a thickness in a range of between about 1000 and 4000 Å.

15. The method of claim 10 wherein said first insulating layer is composed of silicon oxide formed by said SAUSG $O_3$-TEOS process having a thickness in a range of between about 2000 and 8000 Å.

16. The method of claim 10 wherein
a) said semiconductor structure comprises a first dielectric layer over a substrate, and
b) said first insulating layer is formed on said first dielectric layer; and
c) a second dielectric layer is formed on said first insulating layer; said second dielectric layer composed of $SiO_2$ formed by a PE-TEOS process having a thickness in a range of between about 1000 and 5000 Å; and
d) said opening is etched through said first dielectric layer, said first insulating layer and said second dielectric layer.

17. The method of claim 10 step (b) wherein said coating film is formed by said plasma enhanced process using TEOS comprising: using a $O_2$/TEOS feed ratio of between about 500:800 and 700:800; and a deposition temperature of between about 380 and 420° C. to a coating film thickness between about 1000 and 5000 Å.

18. A method of fabricating an insulating layer over a semiconductor structure comprising the sequential steps:
a) cleaning chamber walls of a reactor using chemicals comprising $O_2$, $C_2F_6$ and $NF_3$ in which an insulating layer will be formed on the semiconductor structure;
b) depositing a coating film composed of silicon oxide formed by a plasma enhanced process using TEOS on said chamber walls of said reactor; said plasma enhanced process using TEOS comprises: using a $O_2$/TEOS feed ratio of between about 500:800 and 700:800; and a deposition temperature of between about 380 and 420° C.; said coating film having a thickness between 1000 and 5000 Å;
c) loading the semiconductor structure into said reactor; said semiconductor structure comprises a first dielectric layer over a substrate, and
d) depositing a first insulating layer composed of undoped silicon glass using a SAUSG $O_3$-TEOS process on said first dielectric layer; said first insulating layer is composed of silicon oxide formed by said SAUSG $O_3$-TEOS process with ratio of $O_3$ to TEOS between about 1:10 and 5:10; flow rate of reactant-TEOS between 2000 and 4000 sccm; a $O_2$ flow rate between 3000 and 5000 sccm; a pressure between 100 and 600 torr; a $O_3$ concentration between 9% and 15%; a temperature between 300 and 500° C.; said first insulating layer has a refractive index (Ri) between 1.43 and 1.47 and film tensile stress between about +1.5E9 and 3.85E9 dyne/cm$^2$; said first insulating layer has a thickness in a range of between about 2000 and 8000 Å;
e) removing said semiconductor structure from said reactor;
f) forming a second dielectric layer on said first insulating layer; said second dielectric layer composed of $SiO_2$ formed by a PE-TEOS process having a thickness in a range of between about 1000 and 5000 Å; and
g) etching an opening through at least said first dielectric layer, said first insulating layer, and said second dielectric layer using a buffered oxide etch (BOE) etch whereby said coating film improves the etch uniformity of said first insulating layer.

19. The method of claim 18 which further includes forming a sputtered barrier Ti/TiN layers and tungsten in said opening.

* * * * *

UNITED STATES PATENT AND TRADEMARK OFFICE
CERTIFICATE OF CORRECTION

PATENT NO.    : 6,042,887             Page 1 of 1
DATED         : March 28, 2000
INVENTOR(S)   : Hung-Ju Chien, Chia-Cheng Wang, Been-Hon Lin It is certified that error appears in the above-identified patent and that said Letters Patent is hereby corrected as shown below:

On the Title page, in item (54), please add the word CHAMBER to the Title so that it reads; -- PROCESS FOR FORMING A SAUSG INTER METAL DIELECTRIC LAYER BY PRE-COATING THE REACTOR CHAMBER --.

Signed and Sealed this

Fifth Day of June, 2001

NICHOLAS P. GODICI

Attest:

Attesting Officer

Acting Director of the United States Patent and Trademark Office